US007944116B2

(12) United States Patent
Causier

(10) Patent No.: US 7,944,116 B2
(45) Date of Patent: May 17, 2011

(54) DRIVE CIRCUIT

(75) Inventor: Stephen James Causier, Wiltshire (GB)

(73) Assignee: Dyson Technology Limited, Wiltshire (GB)

( * ) Notice: Subject to any disclaimer, the term of this patent is extended or adjusted under 35 U.S.C. 154(b) by 395 days.

(21) Appl. No.: 12/160,969

(22) PCT Filed: Dec. 11, 2006

(86) PCT No.: PCT/GB2006/004606
§ 371 (c)(1),
(2), (4) Date: Aug. 6, 2008

(87) PCT Pub. No.: WO2007/083075
PCT Pub. Date: Jul. 26, 2007

(65) Prior Publication Data

US 2010/0236092 A1 Sep. 23, 2010

(30) Foreign Application Priority Data

Jan. 17, 2006 (GB) .................................. 0600868.4

(51) Int. Cl.
*H01L 41/09* (2006.01)

(52) U.S. Cl. ....................................... 310/317; 310/321

(58) Field of Classification Search .................. 310/317, 310/318, 314
See application file for complete search history.

(56) References Cited

U.S. PATENT DOCUMENTS 4,642,581 A 2/1987 Erickson
2002/0117939 A1 * 8/2002 Kawamoto .............. 310/316.03
2004/0099218 A1 * 5/2004 Yang et al. .................... 118/726
2007/0242427 A1 * 10/2007 Yamamoto et al. ........... 361/689

FOREIGN PATENT DOCUMENTS

DE 10353835 6/2005
EP 0767504 4/1997
WO WO-01/29957 4/2001
WO WO 2005/080793 * 9/2005

OTHER PUBLICATIONS

GB Search Report directed towards counterpart application No. GB0600868.4; 1 page.
International Search Report directed towards counterpart application No. PCT/GB2006/004606; 3 pages.
International Preliminary Report on Patentability directed towards counterpart application No. PCT/GB2006/004606; 5 pages.

* cited by examiner

*Primary Examiner* — Derek J Rosenau
(74) *Attorney, Agent, or Firm* — Morrison & Foerster LLP

(57) ABSTRACT

A drive circuit for a high-frequency agitation source includes a signal generator generating a train of low voltage square-wave pulses at a drive frequency, a booster including a boost inductor generating a back EMF and configured to produce a high-voltage pulse train in response to the low-voltage square-wave pulse train and a filter producing a drive signal having a pre-determined harmonic of the drive frequency, the drive signal being used to drive the high-frequency agitation source. The drive circuit is particularly suitable for use with piezoelectric crystals.

9 Claims, 5 Drawing Sheets

DRIVE CIRCUIT

REFERENCE TO RELATED APPLICATIONS

This application is a national stage application under 35 USC 371 of International Application No. PCT/GB06/004606, filed Dec. 11, 2006, which claims the priority of United Kingdom Application No. 0600868.4, filed Jan. 17, 2006, the contents of both of which prior applications are incorporated herein by reference.

FIELD OF THE INVENTION

The invention relates to a drive circuit for a high-frequency agitation source. Particularly, the invention relates to a drive circuit for a piezoelectric crystal.

BACKGROUND OF THE INVENTION

Piezoelectric crystals are well known in the art and are used for a number of purposes. Piezoelectric motors, transformers and linear drives are common. An important use for a piezoelectric crystal is in nebulisation. There are many cases where a fine mist of a substance is required without the application of heat. One example of this is a medical nebuliser, wherein a pharmaceutical compound is nebulised by a piezoelectric crystal in order to be inhaled by a patient. Another use for nebulisers is in the field of water dispersal such as garden water features. In order to disperse a dispersal agent effectively, a high voltage, high frequency drive source is required. Typically, a piezoelectric crystal for use in nebulisation is driven at its resonance frequency. This frequency varies between piezoelectric crystals, however it is usually in the region of 1.6-1.7 MHz.

SUMMARY OF THE INVENTION

Drive circuits for piezoelectric crystals are well known in the art. A simple way of generating such a high frequency signal is through the use of a transistor circuit. However, if this is done, a high voltage amplifier or a transformer is required to generate the peak to peak voltages needed to drive a piezoelectric crystal. Typically, these voltages are in the region of 100-150 V. Transformers are the most commonly used components for this purpose. However, they are often bulky and expensive.

A further requirement for an electronic device that will use a mains power supply is that Electromagnetic Compatibility Standards (EMC) have to be met. These standards define an acceptable level for the harmonic content in the current which electrical equipment draws from a mains AC supply, as well as an acceptable level of voltage distortion. A high-voltage square wave signal may contain an unacceptable level of harmonic content both for efficient driving of a piezoelectric crystal and for meeting the required standards of harmonic content. A common way of solving this problem is to pass the signal through a low-pass filter. If the low-pass filter is tuned to the fundamental driving frequency of the piezoelectric crystal, higher order harmonics can be filtered out, leaving only the fundamental frequency to drive the piezoelectric crystal. Often, a low-pass filter is also used to give a voltage gain. However, in order to drive a piezoelectric crystal at resonance, a relatively high quality factor is required. In order to achieve this with a low-pass filter such as an LC circuit, the capacitances of the system in which the LC circuit is located needs to be constant. However, the capacitance of wiring and the piezoelectric crystal itself may vary with temperature, age, condition and use. Therefore, this often makes an LC circuit unsuitable for driving a piezoelectric crystal at the precise resonant frequency.

The invention provides a drive circuit for a high-frequency agitation source, the drive circuit comprising signal generating means for generating a train of low voltage square-wave pulses at a drive frequency, boost means including a boost inductor for generating a back EMF, the boost means being arranged to produce a high-voltage pulse train in response to the low-voltage square-wave pulse train and filter means for producing from the high-voltage pulse train a drive signal having a pre-determined harmonic of the drive frequency, the drive signal being used to drive the high-frequency agitation source. Using the back EMF from an inductor to generate a high-voltage pulse train avoids the use of bulky and expensive transformers.

Preferably, the high-frequency agitation source is a piezoelectric crystal.

Advantageously, the filter means comprises a low-pass filter which includes an inductor in series with the high-frequency agitation source and a capacitor in parallel with the high-frequency agitation source.

The invention provides a simple and cost-effective circuit which is able to generate a high-voltage, high-frequency, clean sine wave signal to drive a piezoelectric crystal. The invention is particularly suitable to drive a nebuliser for use in a hand dryer.

BRIEF DESCRIPTION OF THE DRAWINGS

An embodiment of the invention will now be described with reference to the accompanying drawings, in which.

DETAILED DESCRIPTION OF THE INVENTION

Figure 1:
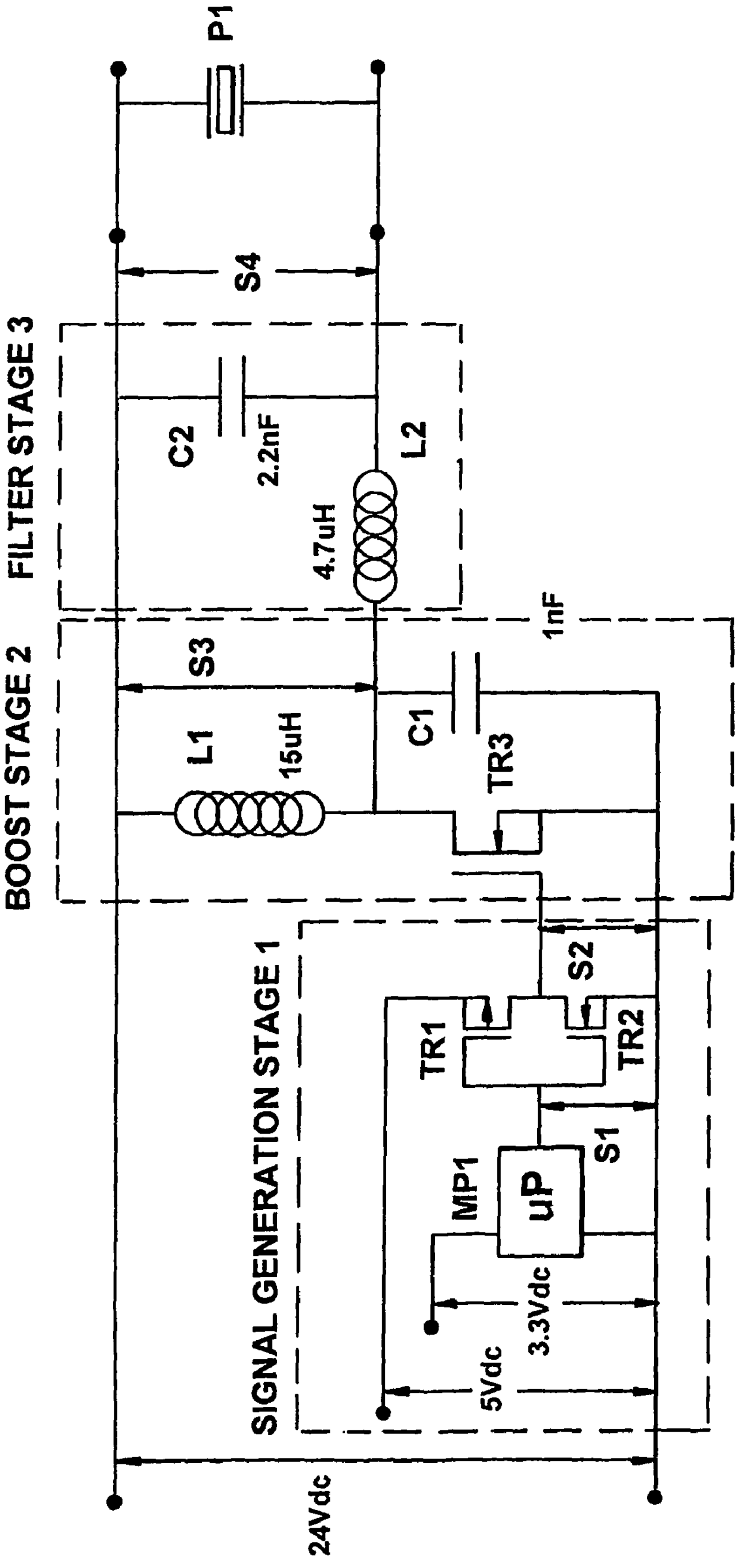
FIG. 1 is a circuit diagram of a drive circuit according to the invention.

FIG. 1 shows a drive circuit according to the invention. The drive circuit is powered by a DC power source (not shown). The DC power source originates from an AC/DC converter powered by a mains electricity supply. The drive circuit comprises three stages: a signal generation stage 1, a boost stage 2 and a filter stage 3. The first stage is the signal generation stage 1. The signal generation stage 1 comprises a microprocessor unit MP1 for generating a synchronisation signal at, say, 1660 KHz. The microprocessor unit MP1 is supplied at low voltage, for example 3.3 V. This microprocessor unit MP1 includes a phase-locked loop for multiplying the synchronisation signal to the required drive frequency. The output from the microprocessor unit MP1 is connected to a pair of complementary push-pull Metal Oxide Semiconductor Field Effect Transistors (MOSFETs) TR1, TR2. MOSFET TR1 is a low power p-channel MOSFET, and MOSFET TR2 is a low power n-channel MOSFET. The pair of MOSFETs TR1, TR2 provide a push-pull output drive. The push-pull arrangement of the MOSFETs TR1, TR2 is required to sink and source the gate charge and minimise switching losses. The output from the push-pull MOSFETs TR1, TR2 is connected to the gate of a power MOSFET TR3. The power MOSFET TR3 is supplied by a 5 V power rail. The source and drain of the power MOSFET TR3 form part of the boost stage 2 and act as a switch in the boost stage 2.

The boost stage 2 comprises an inductor L1, the source/drain of the power MOSFET TR3 and a capacitor C1. The capacitor C1 is connected in parallel across the source/drain of the power MOSFET TR3. These components are connected between the 24 V and ground power rails of the power source. The inductor L1 has an inductance of 15 μH and the capacitor C1 has a capacitance of 1 nF.

Figure 3:
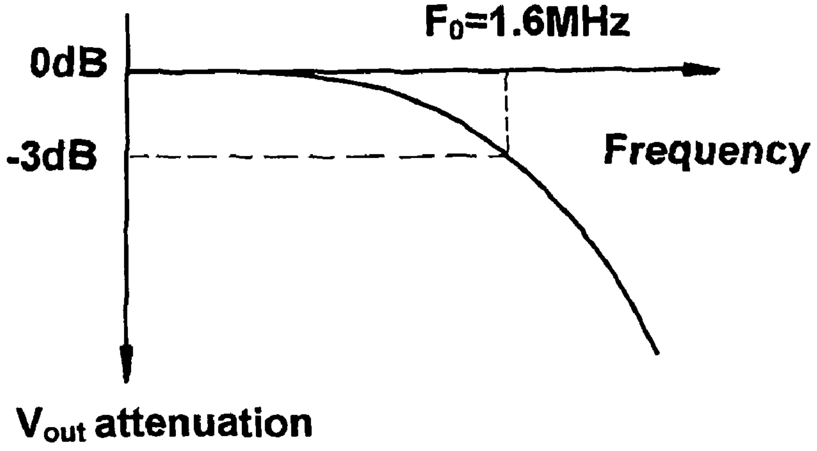
FIG. 3 is a graph showing the cut off frequency of a filter stage.

Connected across the inductor L1 is the filter stage 3. The filter stage 3 comprises a low pass filter. The low-pass filter includes an inductor L2 in series with the boost stage 2, and a capacitor C2 in parallel with the boost stage 2. The capacitance of capacitor C2 and the inductance of the inductor L2 are selected such that the resonant frequency of the low-pass filter is approximately equal to the drive frequency of the piezoelectric crystal. The capacitor C2 has a capacitance of 2.2 nF and the inductor L2 has an inductance of 4.7 μH. FIG. 3 shows the attenuation characteristics of the filter stage. These values are chosen in order to provide a 3 dB roll off frequency of approximately 1.6 MHz. Expressed another way, the resonant frequency of the filter stage 3 is centred on the drive frequency of the piezoelectric crystal according to the relationship $f_0=1/(2\pi\sqrt{LC})$ where L is the inductance of the inductor L2 and C is the capacitance of the capacitor C2. Connected across the output from the filter stage 3 is a piezoelectric crystal P1.

In operation, the microprocessor generates a 1660 KHz synchronisation signal. The phase-locked loop multiplies the synchronisation signal by 1024 to generate a drive signal S1 close to 1.7 MHz. The drive signal S1 from the microprocessor unit MP1 is then supplied to the complementary push-pull transistor driver. The MOSFETs TR1, TR2 of the push-pull drive generate a square-wave signal S2 which is supplied to the power MOSFET TR3.

Figure 2:
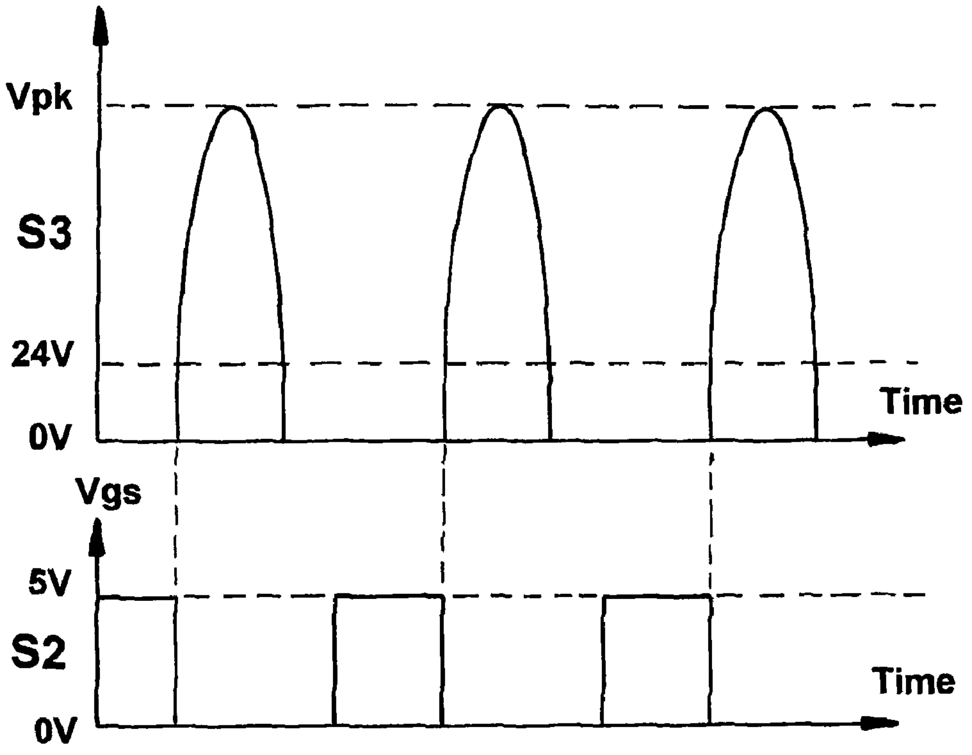
FIG. 2 is a graph showing an input signal S2 to a boost stage and a high-voltage output signal S3 from the boost stage.

The square-wave signal S2 switches the power MOSFET TR3 on or off depending upon whether the square-wave signal S2 is high or low. When the square-wave signal S2 is high, the power MOSFET TR3 is switched on, the source/drain of the power MOSFET TR3 conducts and completes the circuit between the 24 V power rail and ground. When this happens, the inductor L1 begins to charge. When the square-wave signal S2 returns to a low state, the power MOSFET TR3 is switched off. This generates a large rate of change of current in the boost stage 2. The magnetic field established in the inductor L1 during the on phase of the MOSFET TR3 attempts to resist the change in current. This generates a large back EMF in the inductor L1 which produces a high-voltage output signal S3. The high-voltage output signal S3 is shown in FIG. 2. The high-voltage output signal S3 consists of a series of peaks which correspond to the back emf generated by the inductor L1. The timing of the leading edges of the peaks corresponds to the timing of the trailing edges of the square-wave signal S2. The high-voltage output signal S3 has the same duty cycle as the square-wave signal S2. The peak amplitude of the high-voltage output signal S3 is in the region of 90 V. The peak amplitude of the high-voltage output signal S3 is limited by the capacitor C1. The capacitor C1 spreads the energy released by the inductor L1 over a greater time period, reducing the maximum peak voltage generated. This is required to protect the power MOSFET TR3 from damage.

The high-voltage output signal S3 has a high voltage and a pulse period equal to the inverse of the drive frequency. However, it is not a clean signal. By this is meant that the high-voltage output signal S3 comprises a number of different frequencies in addition to the fundamental frequency. Any waveform or pulse train can be expressed as a superposition of sine waves of different harmonic frequencies. The high-voltage output signal S3 comprises a large number of unwanted harmonic frequencies. These harmonic frequencies are undesirable because they may affect the operation of the piezoelectric crystal and generate a large amount of unwanted harmonic distortion.

Figure 4A:
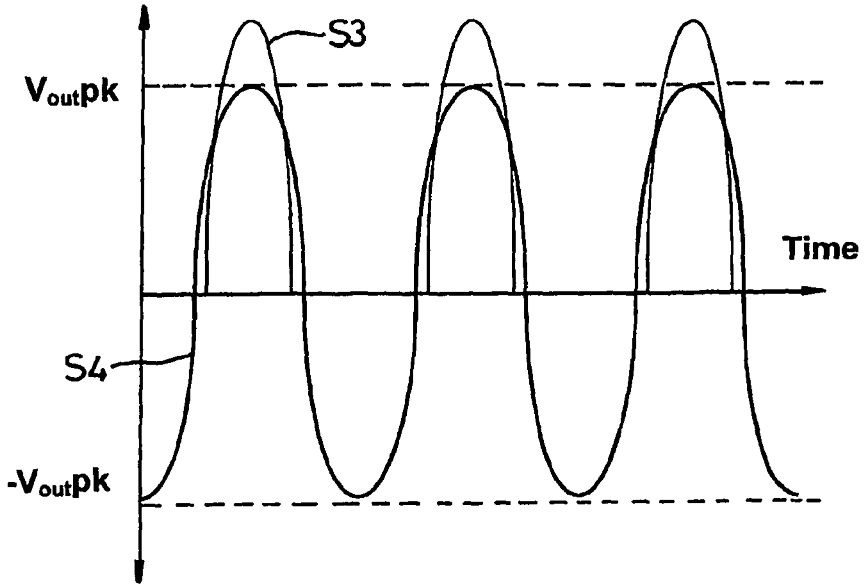
FIG. 4*a* is a graph showing the high-voltage output S3 input to the filter stage and an output waveform S4 outputted from the filter stage.
Figure 4B:
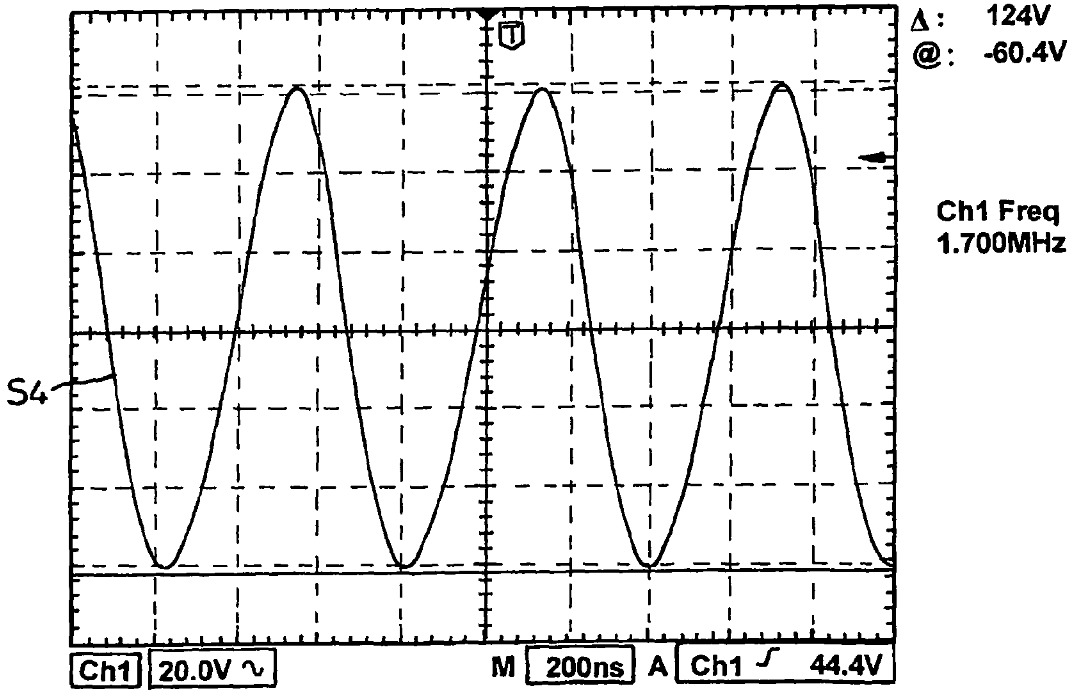
FIG. 4*b* is an oscilloscope trace showing an actual output waveform S4 as supplied to the piezoelectric crystal.
Figure 5:
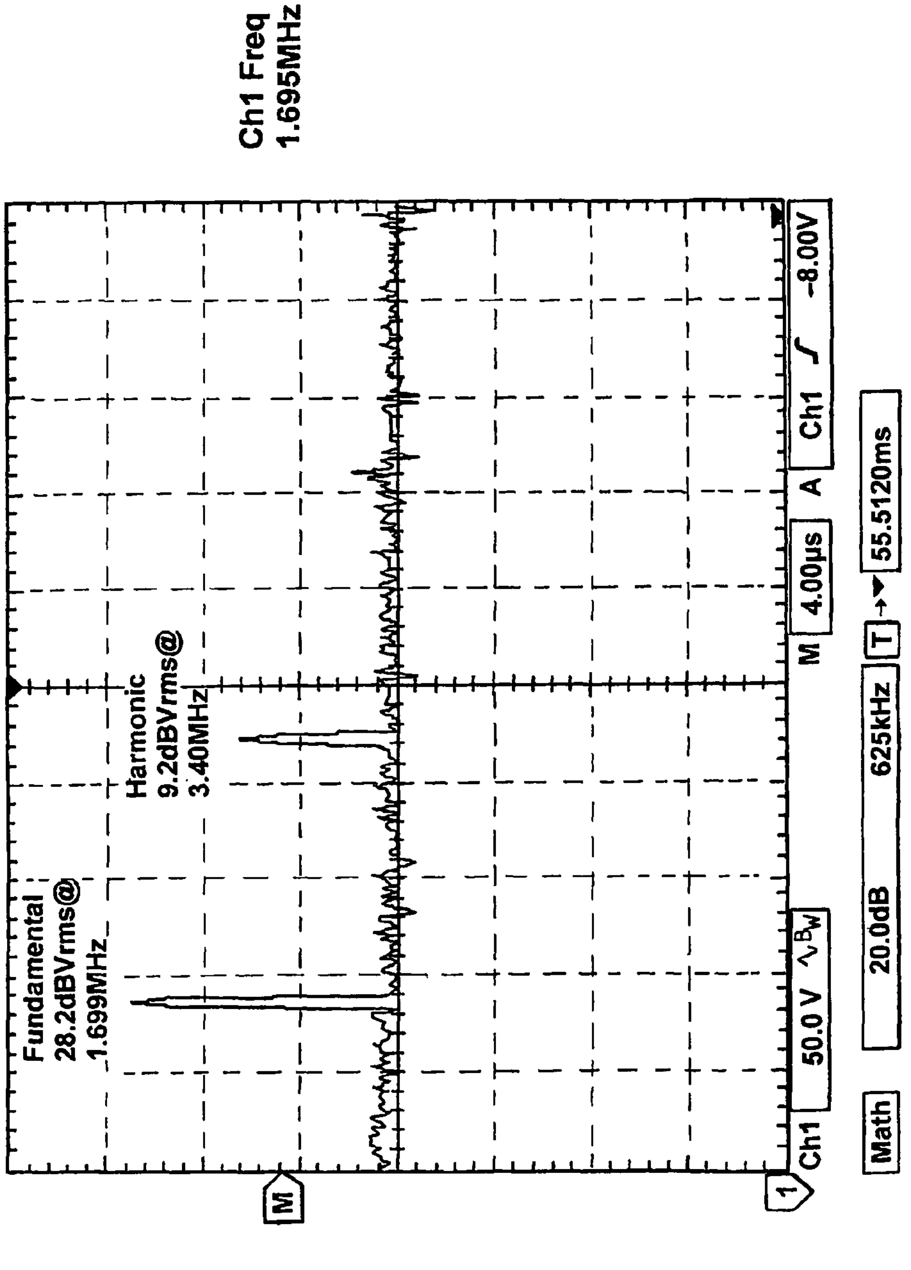
FIG. 5 shows a fast fourier transform of the output waveform S4 illustrating the harmonic components of the waveform S4.

In order to remove the unwanted higher harmonic frequencies from the high-voltage output signal S3 and leave only the fundamental frequency, the filter stage 3 is used. The filter stage 3 removes the higher order harmonics present in the high-voltage output signal S3, and the output S4 from the filter stage 3 is a clean sine wave with a peak-to-peak voltage of 100-140 V and a drive frequency of 1.7 MHz. FIG. 4*a* shows a schematic drawing of the input waveform of the high-voltage output S3 and the output waveform S4. FIG. 4*b* shows an actual output waveform S4 output from the filter stage 3 as "seen" by the piezoelectric crystal P1. The waveform is a sine-wave at the fundamental frequency of approximately 1.7 MHz. FIG. 5 shows a fast Fourier transform of this waveform. The X-axis shows the frequency (in MHz) and the Y-axis shows the strength of the harmonic components (in units of dBVrms). The figure illustrates that the low pass filter successfully removes the majority of the unwanted harmonic frequencies. A component of the second harmonic still remains, however it is attenuated such that the circuit meets EMC requirements. The output S4 is then used to drive the piezoelectric crystal at a frequency of approximately 1.7 MHz.

The above-described embodiment of the invention is a low-cost circuit for generating a clean, high-voltage, high-frequency sinusoidal waveform from a DC source. The invention may be used in any situation where a high frequency agitation source is required to be driven cheaply and effectively. The low component count of the circuit and the absence of a transformer also reduces the physical size of the circuit. This is of benefit to applications where size is a crucial factor, for example, household appliances or medical devices.

Figure 6:
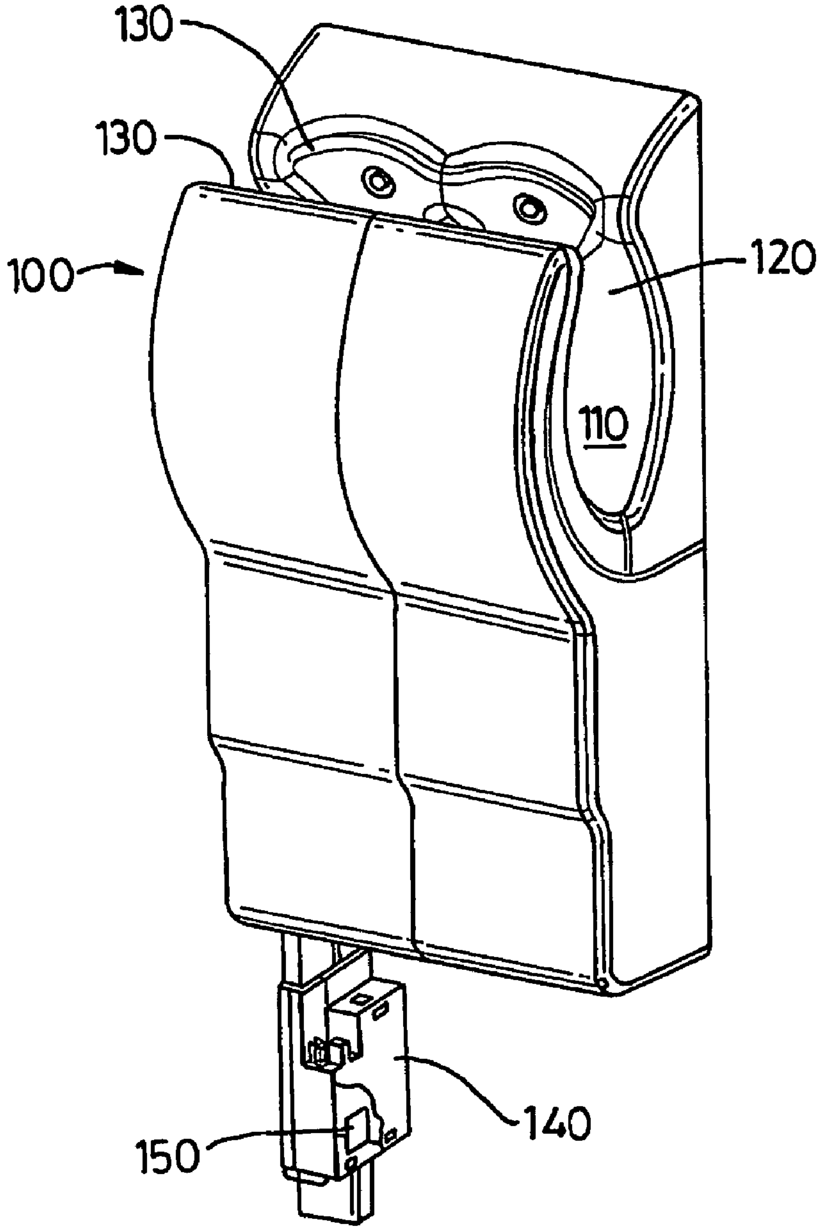
FIG. 6 shows a hand dryer incorporating a nebuliser driven by the drive circuit of FIG. 1.

The above-described embodiment of the invention is particularly suited for use in a hand dryer such as that shown in FIG. 6. The hand dryer 100 includes a cavity 110. The cavity 110 is open at its upper end 120 and the dimensions of the opening are sufficient to allow a user's hands (not shown) to be inserted easily into the cavity 110 for drying. A high-speed airflow is generated by a motor unit having a fan (not shown). The high-speed airflow is expelled through two slot-like openings 130 disposed at the upper end 120 of the cavity 110 to dry the user's hands. A drain (not shown) for draining the water removed from a user's hands from the cavity 110 is located at the lower end of the cavity 110. A nebuliser 140 is located downstream of the drain. The nebuliser 140 is shown partially removed from the hand dryer 100 in FIG. 6. The nebuliser 140 is partially cut away to show the location of the above-described drive circuit 150. The nebuliser 140 includes a collector (not shown) for collecting waste water and a piezoelectric crystal (not shown) for nebulising the waste water. The piezoelectric crystal is driven by the drive circuit 150. The low component count and low cost of the drive circuit means that it is smaller, cheaper to manufacture and less likely to fail. This means that the size of the hand dryer can be reduced, the reliability of the hand dryer can be improved and the cost of maintenance is reduced.

It will be appreciated that the invention is not limited to the embodiment illustrated in the drawings. The magnitude and frequency of the drive source may be varied depending upon the required application. For example, it is common to drive a piezoelectric crystal at a range of frequencies. However, it is most common to drive a piezoelectric crystal at, or close to, its resonant frequency. For most piezoelectric crystals this frequency lies in the range between 1.5 to 2 MHz.

Further, the physical quantities of the described electronic components also may be varied in value. This could be done, for example, to change the resonant point of the filter stage, or to increase or decrease the back EMF generated by the boost inductor. However, it is desirable that the back EMF generated by the boost inductor is greater than 50 V.

There need not be only one low-pass LC filter. The filter stage 3 may comprise two LC filters in series to attenuate better the higher harmonic frequencies. Further, other forms of signal generator could be used. What is important is that an inductor is used to generate a back EMF to amplify a pulse train, and this signal is then converted into a single-frequency sine wave using a filter.

The invention claimed is:

1. A hand dryer, comprising:

a nebulizer, the nebulizer comprising a drive circuit for a high-frequency agitation source, the drive circuit comprising:

a signal generating stage generating a train of low voltage square-wave pulses at a drive frequency, a boost stage including a boost inductor for generating a back EMF, the boost stage being configured to produce a high-voltage pulse train in response to the low-voltage square-wave pulse train, and a filter stage producing from the high-voltage pulse train a drive signal having a pre-determined harmonic of the drive frequency, the drive signal being used to drive the high-frequency agitation source.

2. The drive circuit of claim 1, wherein the high-frequency agitation source is a piezoelectric crystal.

3. The drive circuit of claim 1, wherein the filter stage comprises a low-pass filter.

4. The drive circuit of claim 3, wherein the filter stage comprises an inductor in series with the high-frequency agitation source and a capacitor in parallel with the high-frequency agitation source.

5. The drive circuit of claim 1, further comprising a DC power source and a power rail supplied by the DC power source.

6. The drive circuit of claim 5, wherein the boost inductor is connected in parallel between the power rail of the DC power source and ground.

7. The drive circuit of claim 5, wherein the boost stage further comprises a switch that switches the power rail on or off in response to the train of low-voltage square-wave pulses.

8. The drive circuit of claim 1, wherein the drive signal frequency produced by the drive circuit is in the region of 1.5-2 MHz.

9. The drive circuit of claim 1, wherein the boost inductor generates a back EMF greater than 50 V.

* * * * *